United States Patent
Buffa et al.

(10) Patent No.: US 10,541,683 B2
(45) Date of Patent: Jan. 21, 2020

(54) SYSTEM AND METHOD FOR HIGH-OHMIC CIRCUIT

(71) Applicant: Infineon Technologies AG, Neubiberg (DE)

(72) Inventors: Cesare Buffa, Villach (AT); Elmar Bach, Villach (AT)

(73) Assignee: Infineon Technologies AG, Neubiberg (DE)

( * ) Notice: Subject to any disclaimer, the term of this patent is extended or adjusted under 35 U.S.C. 154(b) by 78 days.

(21) Appl. No.: 15/063,067

(22) Filed: Mar. 7, 2016

(65) Prior Publication Data

US 2017/0257093 A1    Sep. 7, 2017

(51) Int. Cl.
 - H03K 17/687    (2006.01)
 - G06F 17/50    (2006.01)
 - H04R 19/04    (2006.01)

(52) U.S. Cl.
 CPC ..... H03K 17/6874 (2013.01); G06F 17/5036 (2013.01); H04R 19/04 (2013.01); *H04R 2201/003* (2013.01)

(58) Field of Classification Search
 CPC ..... H04R 3/00; H04R 19/04; H04R 2201/003
 See application file for complete search history.

(56) References Cited

U.S. PATENT DOCUMENTS

| | | | |
|---|---|---|---|
| 7,149,317 B2 | 12/2006 | Lafort | |
| 8,401,208 B2 | 3/2013 | Ceballos et al. | |
| 8,680,926 B2* | 3/2014 | Mucha | H03F 1/32 330/207 P |
| 8,983,090 B2* | 3/2015 | Kim | H04R 3/00 381/111 |
| 9,675,809 B2* | 6/2017 | Chow | A61N 1/3787 |

* cited by examiner

*Primary Examiner* — Long Nguyen
*Assistant Examiner* — Colleen J O Toole
(74) *Attorney, Agent, or Firm* — Slater Matsil, LLP

(57) ABSTRACT

A high-ohmic circuit includes a plurality of high-ohmic branches coupled in parallel between a first node and a second node. Each of the plurality of high-ohmic branches includes a first plurality of series connected resistive elements forming a first series path from the first node to the second node, each of the first plurality of series connected resistive elements comprising a first diode-connected transistor. Each of the plurality of high-ohmic branches further includes a second plurality of series connected resistive elements forming a second series path from the first node to the second node, each of the second plurality of series connected resistive elements comprising a second diode-connected transistor. The high-ohmic circuit further includes a plurality of switches, each of the switches being coupled between a corresponding one of the plurality of high-ohmic branches and the second node.

31 Claims, 15 Drawing Sheets

SYSTEM AND METHOD FOR HIGH-OHMIC CIRCUIT

TECHNICAL FIELD

The present disclosure relates generally to electrical circuits, and, in particular embodiments, to a system and method for a high-ohmic circuit.

BACKGROUND

Transducers convert signals from one domain to another and are often used in sensors. A common transducer used as a sensor that is seen in everyday life is a microphone, which is essentially an audio signal transducer that converts sound waves to electrical signals.

One way of constructing a microphone is by using a microelectromechanical system (MEMS) based sensor that gathers information from the environment by measuring a change in an electrical parameter in response to a mechanical movement. For example, MEMS microphone may have a movable diaphragm having a capacitance that varies with physical deflection. Electronics attached to the MEMS then process the signal information derived from the sensors. MEMS devices may be manufactured using micromachining fabrication techniques similar to those used for integrated circuits.

Audio microphones are commonly used in a variety of consumer applications such as cellular telephones, digital audio recorders, personal computers and teleconferencing systems. In a MEMS microphone, a pressure sensitive diaphragm is disposed directly onto an integrated circuit. As such, the microphone is contained on a single integrated circuit rather than being fabricated from individual discrete parts.

MEMS devices may be formed as oscillators, resonators, accelerometers, gyroscopes, pressure sensors, microphones, microspeakers, micro-mirrors, and other devices, and often use capacitive sensing techniques for measuring the physical phenomenon being measured. In such applications, the capacitance change of the capacitive sensor is converted into a usable voltage or current using interface circuits. In order to operate such capacitive sensors, the interface circuits may include biasing elements, such as a charge pump and sensing elements, such as resistors, capacitors, and amplifiers. The design and manufacture of the interface circuit introduces numerous characteristics to the capacitive sensor behavior.

SUMMARY

A high-ohmic circuit includes a plurality of high-ohmic branches coupled in parallel between a first node and a second node. Each of the plurality of high-ohmic branches includes a first plurality of series connected resistive elements forming a first series path from the first node to the second node, each of the first plurality of series connected resistive elements comprising a first diode-connected transistor. Each of the plurality of high-ohmic branches further includes a second plurality of series connected resistive elements forming a second series path from the first node to the second node, each of the second plurality of series connected resistive elements comprising a second diode-connected transistor. The high-ohmic circuit further includes a plurality of switches, each of the switches being coupled between a corresponding one of the plurality of high-ohmic branches and the second node.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1A:
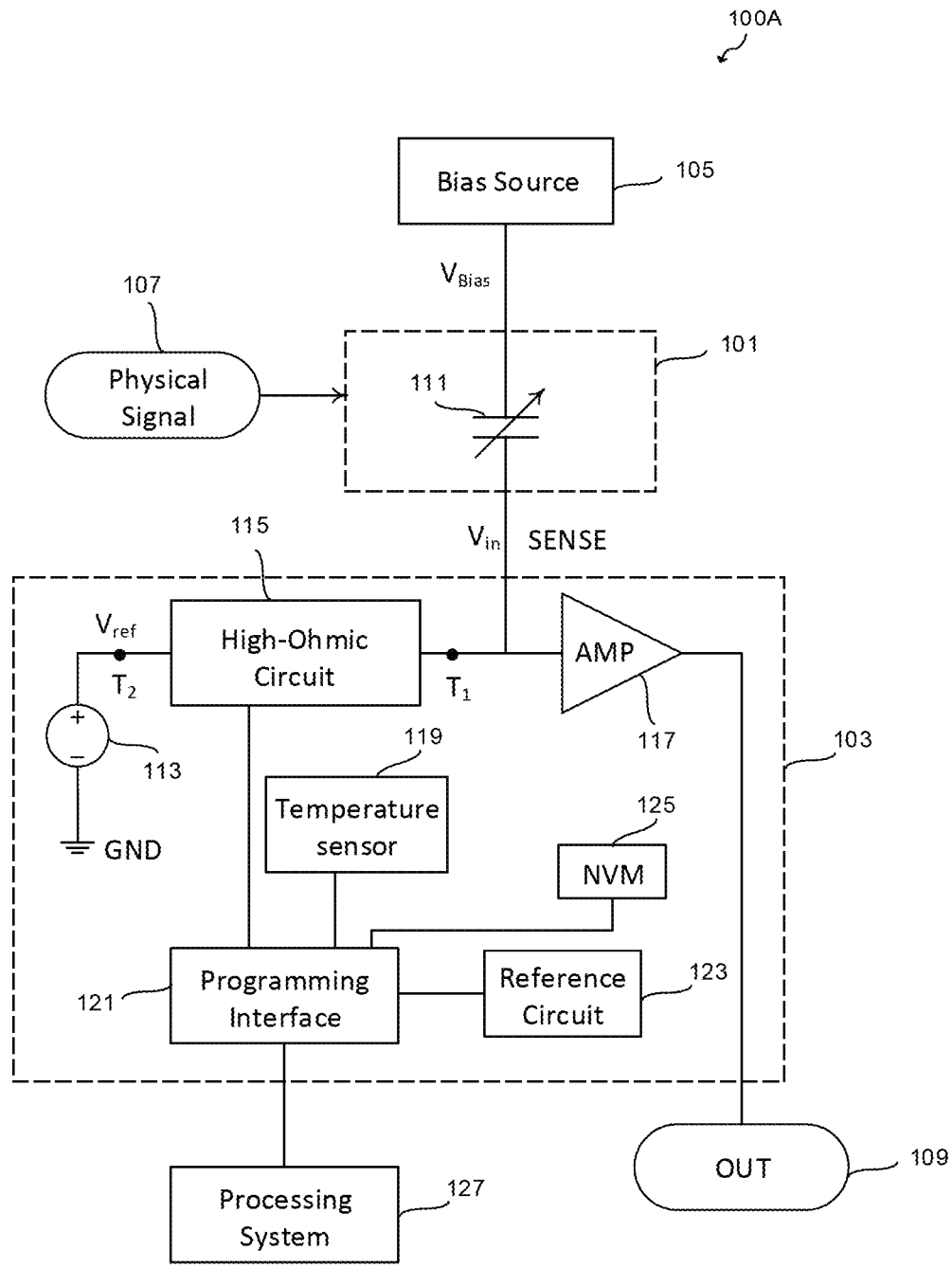
FIGS. 1A, 1B and 1C illustrate schematic block diagrams of embodiment MEMS sensor systems.

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Description is made with respect to various embodiments in a specific context, namely microphone transducers, and more particularly, MEMS microphones. Some of the various embodiments described herein include MEMS transducer systems, MEMS microphone systems, interface circuits for MEMS transducer systems, interface circuits including biasing elements, and high-ohmic circuits. In other embodiments, aspects of various embodiments may also be applied to other applications involving any type of transducer or interface circuits according to any fashion as known in the art. For example, high-ohmic circuits such as those described herein may be used to provide a high-ohmic feedback for an amplifier.

Interface circuits are generally included in order to bias elements of a processing or sensing circuit and to provide readout functionality for information from the processing or sensing circuit. In particular, capacitive sensing circuits generally include circuits for biasing of the capacitive elements and readout of sensed values. According to various embodiments, capacitive sensors, and particularly MEMS capacitive sensors, including specifically MEMS capacitive microphones, include bias circuits with amplifier or buffer circuits, biasing voltage generators, such as charge pumps, and high-ohmic circuits. In various such embodiment systems, the elements may be produced in an integrated circuit system. For example, the MEMS capacitive sensor, such as a MEMS capacitive microphone, may be formed on a first integrated circuit (IC) die and the interface circuits including the high-ohmic circuit and the biasing voltage generator may be formed on a second IC die. In another example embodiment, the MEMS capacitive sensor and the interface circuits are formed on a monolithic IC. In both such embodiments, the high-ohmic circuit is formed of integrated elements and is not a discrete resistor. Further, the high-ohmic circuit may have resistance values of the order of gigaohms (GΩ) or even as high as teraohms (TΩ) in some embodiments. Specifically, the high-ohmic circuit may have a resistance value ranging from 100 GΩ to 100 TΩ for MEMS capacitive microphones.

According to various embodiments described herein, a high-ohmic circuit includes multiple integrated devices, such as diode structures, diode-connected transistors, or the like, formed in a semiconductor substrate. The multiple devices are connected in series between a first resistor node and a second resistor node to form one or more high-ohmic branches of the high-ohmic resistor. The one or more high-ohmic branches are connected in parallel between the first resistor node and the second resistor node to form a high-ohmic resistor. In some embodiments, the high-ohmic resistor further includes a low-impedance branch coupled between the first resistor node and the second resistor node. The one or more high-ohmic branches are configured to be turned on or off depending on design requirements for a MEMS sensor, process corners of diode-connected transistors used to form the one or more high-ohmic branches, and temperature. Accordingly, desired resistance value can be obtained by suitably programming the high-ohmic resistor. Various embodiment, systems, applications, implementations, and models are described further hereinafter in order to illustrate some of the various embodiments.

FIG. 1A illustrates a schematic block diagram of an embodiment MEMS sensor system 100A including a MEMS sensor 101, an interface circuit 103, and bias source 105. According to various embodiments, the MEMS sensor 101 is biased by a bias voltage $V_{Bias}$, receives a physical signal 107, and generates a sensed signal SENSE. In some embodiments, the MEMS sensor 101 may be a MEMS capacitive sensor, such as a MEMS capacitive microphone and may include a capacitor 111 having variable capacitance. In alternative embodiments, the MEMS sensor 101 is any type of capacitive circuit. In various embodiments, the interface circuit 103 receives the sensed signal SENSE from the MEMS sensor 101 and generates an output signal 109. In such embodiments, the sensed signal SENSE may be an analog or continuous time signal, or a discrete signal generated through a transduction mechanism in the MEMS sensor 101. Specifically, the physical signal 107, which may be a pressure or sound wave, for example, produces a corresponding variation of the capacitance 111 in the MEMS sensor 101, such as through deflection of one or more capacitive electrodes, which produces a current or voltage signal output of MEMS sensor 101 as the sensed signal SENSE.

Interface circuit 103 receives the sensed signal SENSE, such as a voltage $V_{in}$, and buffers or amplifies the signal. In some embodiments, the interface circuit 103 may include a high-ohmic circuit 115 coupled to a voltage source 113 and an amplifier 117. The voltage source 113 provides a reference voltage $V_{ref}$ to a reference node $T_2$ of the high-ohmic circuit 115, while the MEMS sensor 101 provides the voltage $V_{in}$ to an input node $T_1$. The high-ohmic circuit 115 maintains a constant charge level on the MEMS sensor 101 (such as a charge level on the capacitor 111 of the MEMS sensor 101), while the amplifier 117 receives transduced signal, such as the voltage $V_{in}$. In some embodiments, the amplifier 117 operates as a buffer and does not provide amplification, i.e., has a gain of 1. In other embodiments, the amplifier 117 provides amplification. In various embodiments, the high-ohmic circuit 115 provides a high resistance path to a ground node GND in order to remove charge variations for the high impedance node connected to the input of the amplifier 117. In some embodiments, the amplifier 117 is a single-input, single-output amplifier.

As described below in greater detail, in some embodiment, the high-ohmic circuit 115 may be implemented using diode structures, such as diode-connected transistors. Furthermore, the high-ohmic circuit 115 may be programmed to act as a high-ohmic resistor having a desired resistance, by taking into account temperature and process variations, and characteristics of the MEMS sensor 101. In such embodiments, the interface circuit 103 may further include a temperature sensor 119 and a reference circuit 123 formed adjacent to the high-ohmic circuit 115, and a programming interface 121 coupled to the high-ohmic circuit 115, the temperature sensor 119, and the reference circuit 123. The temperature sensor 119 may be a band-gap temperature sensor, or the like. The programming interface 121 may be an I²C interface, or the like. As described in greater detail below, the reference circuit 123 may include one or more reference diode-connected transistors that are tested to determine a process corner for the high-ohmic circuit 115. The one or more reference diode-connected transistors may have similar structures as diode-connected transistors of the high-ohmic circuit 115. The interface circuit 103 may further include a non-volatile memory (NVM) 125 couple to the programming interface 121 and configured to store process corner information for the high-ohmic circuit 115. In some embodiments, the NVM 125 may include a one-time programmable memory, a flash memory, or the like.

The MEMS sensor system 100A may further include a processing system 127 coupled to the interface circuit 103 through the programming interface 121. In some embodiment, based on temperature and process variations, the processing system 127 generates and sends a control signal to the high-ohmic circuit 115 through the programming interface 121. Based on the control signal, the high-ohmic circuit 115 is programmed to have a desired resistance value.

In the illustrated embodiment, the MEMS sensor 101 and the interface circuit 103 are formed on two separate semiconductor dice, while the bias source 105 is an external bias source. In particular, the MEMS sensor 101 is formed on a first die, such as a MEMS die and the interface circuit 103 is formed on a second die, such as an application specific integrated circuit (ASIC) die. In such an embodiment, the first die and the second die may be bonded together, such as through flip-chip bonding, for example. In other embodiments, the MEMS sensor 101 may be formed a MEMS die, and the bias source 105 may be included in the interface circuit 103 that is formed on an ASIC die. In yet other embodiments, the MEMS sensor 101, the interface circuit 103, and the bias source 105 may be monolithically integrated in a single semiconductor die. Thus, in various embodiments, the MEMS sensor 101, the interface circuit 103, and the bias source 105 may include elements that are compatible with semiconductor fabrication techniques.

Figure 1B:
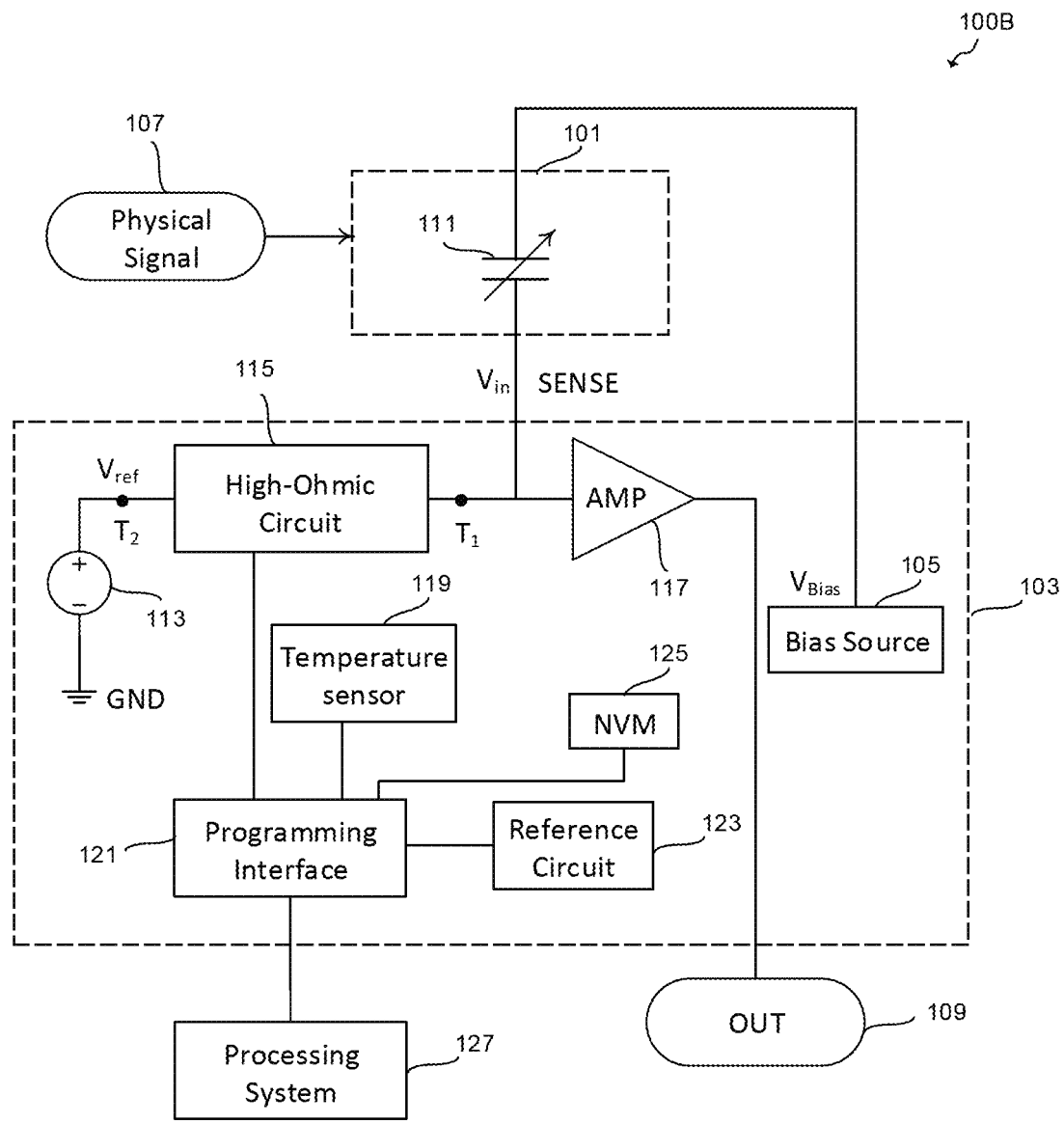

FIG. 1B illustrates a schematic block diagram of an embodiment MEMS sensor system 100B. The MEMS sensor system 100B includes similar elements as described in reference to the MEMS sensor system 100A (see FIG. 1A). Description of commonly numbered elements applies to all instances of the commonly number elements and will not be repeated in the interest of brevity. In the illustrated embodiment, the bias source 105 is included in the interface circuit 103.

Figure 1C:
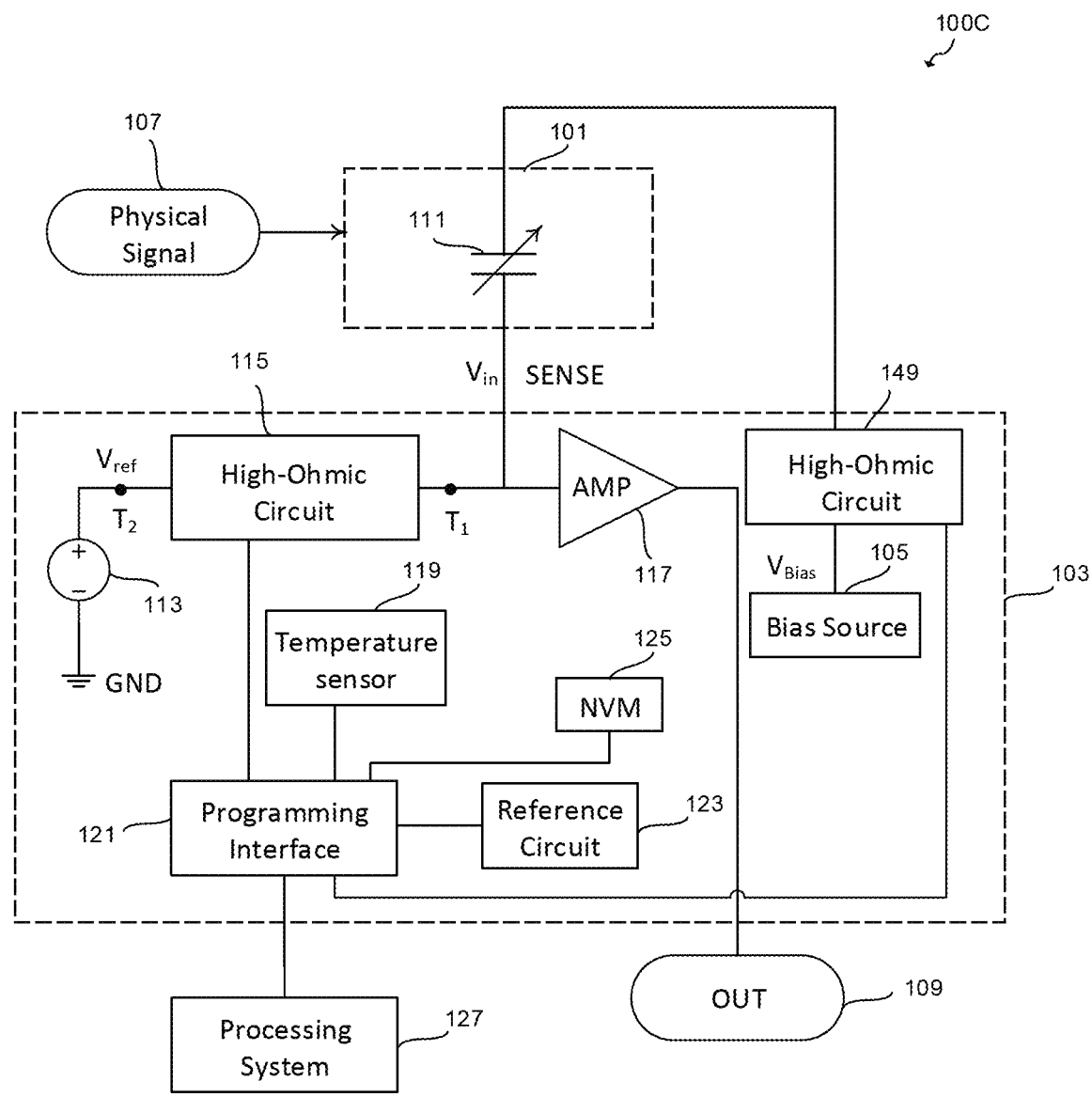

FIG. 1C illustrates a schematic block diagram of an embodiment MEMS sensor system 100C. The MEMS sensor system 100C includes similar elements as described in reference to the MEMS sensor system 100A (see FIG. 1A). Description of commonly numbered elements applies to all instances of the commonly number elements and will not be repeated in the interest of brevity. In the illustrated embodiment, the bias source 105 is included in the interface circuit 103. In some embodiments, the interface circuit 103 may further include a high-ohmic circuit 149 coupled between the MEMS sensor 101 and the bias source 105, where the high-ohmic circuit 149 is connected to the programming interface 121. In some embodiments, the high-ohmic circuit 149 is similar to the high-ohmic circuit 115, and may be programmed using similar methods as the high-ohmic circuit 115.

Figure 1D:
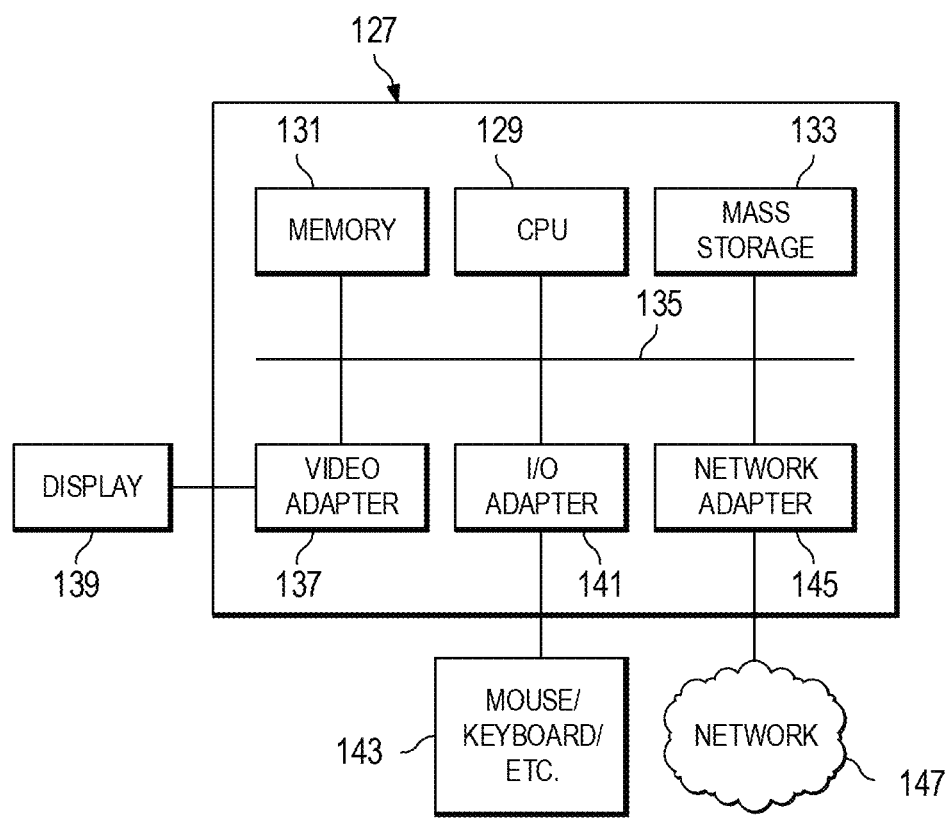
FIG. 1D illustrates a schematic block diagram of an embodiment processing system.

FIG. 1D illustrates a schematic block diagram of the processing system 127. The processing system 127 may include, for example, a central processing unit (CPU) 129, a memory 131, and a mass storage device 133 connected to a bus 135 configured to perform the method steps described herein. In some embodiments, the NVM 125 may be excluded from the interface circuit 103 and the mass storage device 133 may be configured instead to store process corner information for the high-ohmic circuit 115. The processing system 127 may further include, if desired or needed, a video adapter 137 to provide connectivity to a local display 139 and an input-output (I/O) adapter 141 to provide an input/output interface for one or more input/output devices 143, such as a mouse, a keyboard, printer, tape drive, CD drive, or the like.

The processing system 127 may also include a network interface 145, which may be implemented using a network adaptor configured to be coupled to a wired link, such as an Ethernet cable, USB interface, or the like, and/or a wireless/cellular link for communications with a network 147. The network interface 145 may also comprise a suitable receiver and transmitter for wireless communications. It should be noted that the processing system 127 may include other components. For example, the processing system 127 may include power supplies, cables, a motherboard, removable storage media, cases, and the like. These other components, although not shown, are considered part of the processing system 127.

Figure 2A:
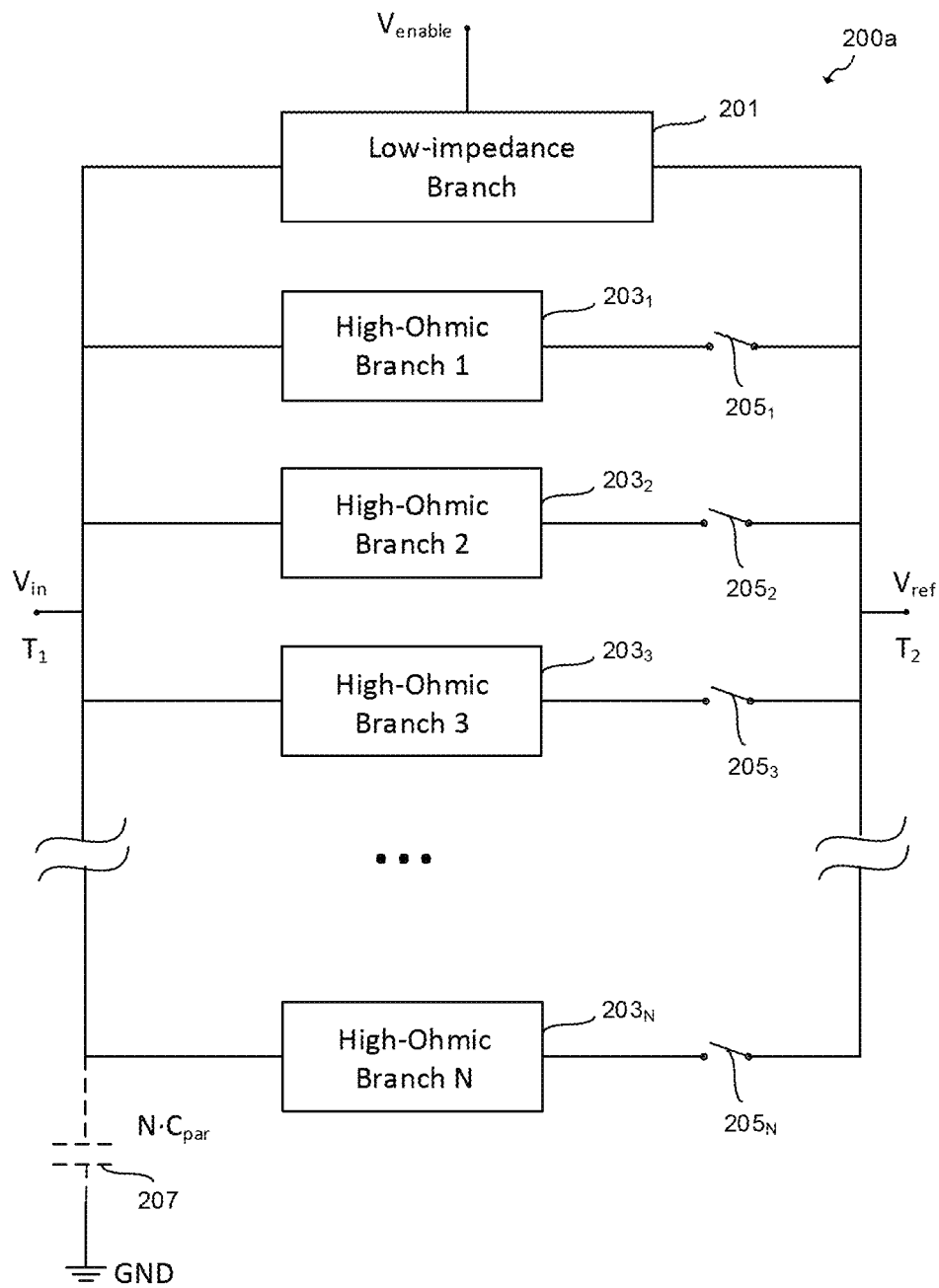
FIGS. 2A and 2B illustrate schematic block diagrams of embodiment high-ohmic circuits.
Figure 2B:
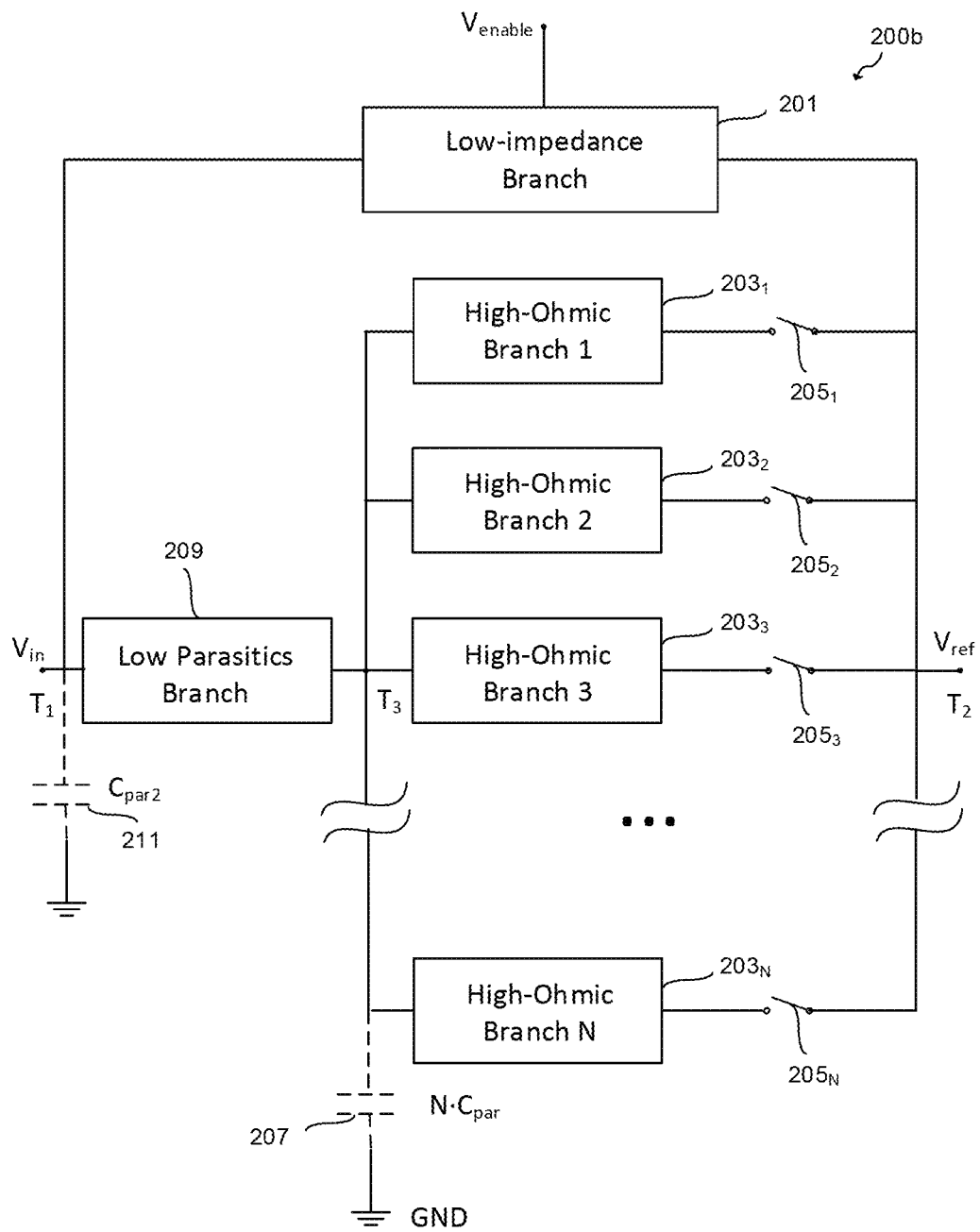

FIGS. 2A and 2B illustrate schematic block diagrams of embodiment high-ohmic circuits 200a and 200b, respectively, which may be implemented as the high-ohmic circuit 115 of the MEMS sensor systems 100A, 100B and 100C (see FIGS. 1A, 1B and 1C, respectively) or as the high-ohmic circuit 149 of the MEMS sensor system 100C (see FIG. 1C). Referring to FIG. 2A, the high-ohmic circuit 200a includes high-ohmic branches $203_1$ to $203_N$ that are connected in parallel between the input node $T_1$ and the reference node $T_2$. In some embodiments, the number N of the high-ohmic branches $203_1$ to $203_N$ may be between 1 and 7. As described below in greater detail, the high-ohmic branches $203_1$ to $203_N$ may be implemented as circuits comprising diodes, diode-connected transistors, and the like. In some embodiments, the high-ohmic branches $203_1$ to $203_N$ may be implemented as similar or identical circuits. In such embodiments, the high-ohmic branches $203_1$ to $203_N$ may not have similar resistances due to process variations. In other embodiments, the high-ohmic branches $203_1$ to $203_N$ may be implemented as different circuits. The high-ohmic circuit 200a may further include switches $205_1$ to $205_N$, which are coupled between respective high-ohmic branches $203_1$ to $203_N$ and the reference node $T_2$. As described below in greater detail, the switches $205_1$ to $205_N$ are used to program the high-ohmic circuit 200a such that a resistance of the high-ohmic circuit 200a is set to a desired value. Such a programming is achieved by turning on or turning off desired switches $205_1$ to $205_N$. In some embodiments, any number of switches $205_1$ to $205_N$ may be turned on or off. A particular configuration of the switches $205_1$ to $205_N$ depends on design specifications of the MEMS sensor 101, process corners and temperature. By taking into account design specifications of the MEMS sensor 101, process corners and temperature, the high-ohmic circuit 200a may be programmed to a desired resistance value. In some embodiments, tunability of the resistance of the high-ohmic circuit 200a allows for compensating process variations of the MEMS sensor 101. For example, the MEMS sensor 101 with a high leakage may be compensated by reducing the resistance of the high-ohmic circuit 200a.

In some embodiments, a resistance of the high-ohmic circuit 200a may be high, such that a start-up time for the MEMS sensor 101 (see FIG. 1A) may not meet the desired specification. For example, a charging time of the capacitor 111 of the MEMS sensor 101 may be higher than a desired value. In some embodiments, the high-ohmic circuit 200a may further include a low-impedance branch 201. The low-impedance branch 201 is coupled between the input node $T_1$ and the reference node $T_2$, and in parallel with the high-ohmic branches $203_1$ to $203_N$. In some embodiments, an enable signal $V_{enable}$ may be provided to the low-impedance branch 201 to activate or deactivate the low-impedance branch 201. The enable signal $V_{enable}$ may be provided to the low-impedance branch 201, for example, by a suitable reference voltage source.

In some embodiments, during the start-up, the low-impedance branch 201 is activated to act as a low-impedance circuit. Accordingly, the high-ohmic circuit 200a may have low impedance such that the start-up time of the MEMS sensor 101 meets design specifications. In the start-up regime, a resistance of high-ohmic circuit 200a may be between about 1 kiloohm (KΩ) and about 1 megaohm (MΩ). During a sensing regime, the low-impedance branch 201 is deactivated to act as a high-ohmic resistor. Accordingly, the high-ohmic circuit 200a may act as a high-ohmic resistor. In the sensing regime, a resistance of high-ohmic circuit 200a may be between about 100 MΩ and about 100 TΩ. In the illustrated embodiment, as the high-ohmic branches $203_1$ to $203_N$ are connected in parallel, the input node $T_1$ has a parasitic capacitance 207 of N times $C_{par}$, where $C_{par}$ is a parasitic capacitance of one of the high-ohmic branches $203_1$ to $203_N$.

FIG. 2B illustrates a schematic block diagram of an embodiment high-ohmic circuit 200b, which may be implemented as the high-ohmic circuit 115 of the MEMS sensor systems 100A, 100B and 100C (see FIGS. 1A, 1B and 1C, respectively) or as the high-ohmic circuit 149 of the MEMS sensor system 100C (see FIG. 1C). The high-ohmic circuit 200b includes similar elements as described in reference to the high-ohmic circuit 200a (see FIG. 2A). Description of commonly numbered elements applies to all instances of the commonly number elements and will not be repeated in the interest of brevity. In some embodiments, the high-ohmic circuit 200b includes the high-ohmic branches $203_1$ to $203_N$ that are connected in parallel between a node $T_3$ and the reference node $T_2$. The switches $205_1$ to $205_N$ are couple between respective high-ohmic branches $203_1$ to $203_N$ and the reference node $T_2$. The high-ohmic circuit 200b further includes a low-parasitics branch 209 coupled between the input node $T_1$ and the node $T_3$, and the low-impedance branch 201 coupled between the input node $T_1$ and the reference node $T_2$. In some embodiments, the low-parasitics branch 209 may be implemented using similar circuit elements as the low-impedance branch 201 or the high-ohmic branches $203_1$ to $203_N$. In some embodiments, a circuit similar to the high-ohmic branches $203_1$ to $203_N$ may be implemented as the low-parasitics branch 209. As the high-ohmic branches $203_1$ to $203_N$ are connected in parallel, the input node $T_3$ has a parasitic capacitance 207 of N times $C_{par}$, where $C_{par}$ is a parasitic capacitance of one of the high-ohmic branches $203_1$ to $203_N$. By coupling the low-parasitics branch 209 between the input node $T_1$ and the node $T_3$, a parasitic capacitance 211 at the input node $T_1$ may be set to $C_{par2}$, where $C_{par2}$ is a parasitic capacitance of the low-parasitics branch 209. In some embodiments in which a circuit similar to the high-ohmic branches $203_1$ to $203_N$ is implemented as the low-parasitics branch 209, $C_{par2}$ is equal to $C_{par}$, and the parasitic capacitance at the input node $T_1$ is reduced N times compared to the parasitic capacitance at the node $T_3$.

Figure 3A:
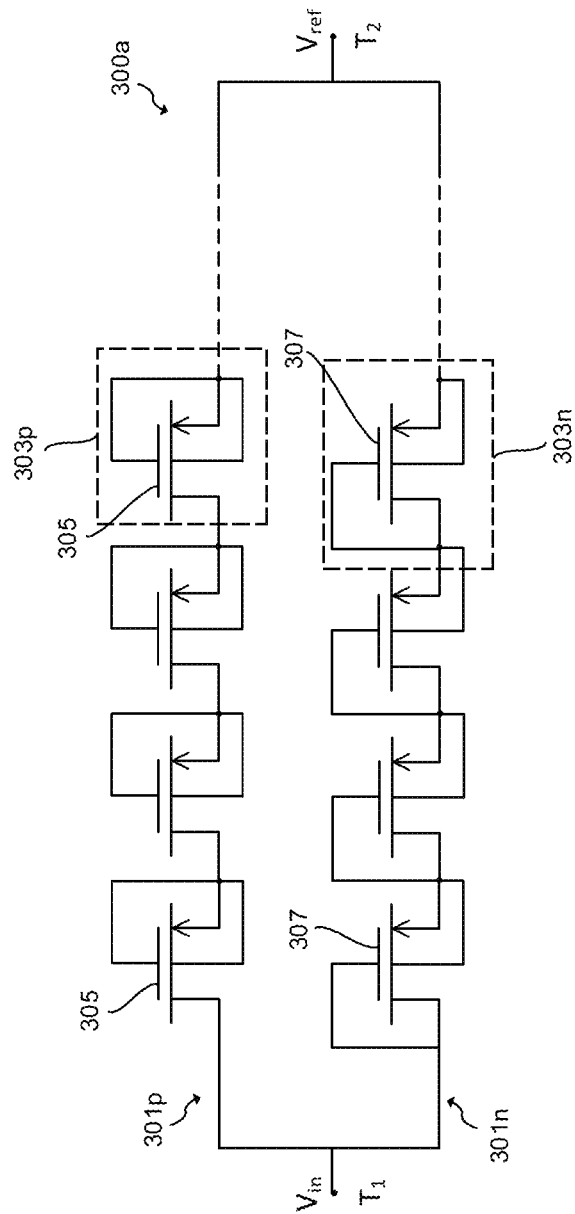
FIGS. 3A and 3B illustrate high-ohmic branches of embodiment high-ohmic circuits.
Figure 3B:
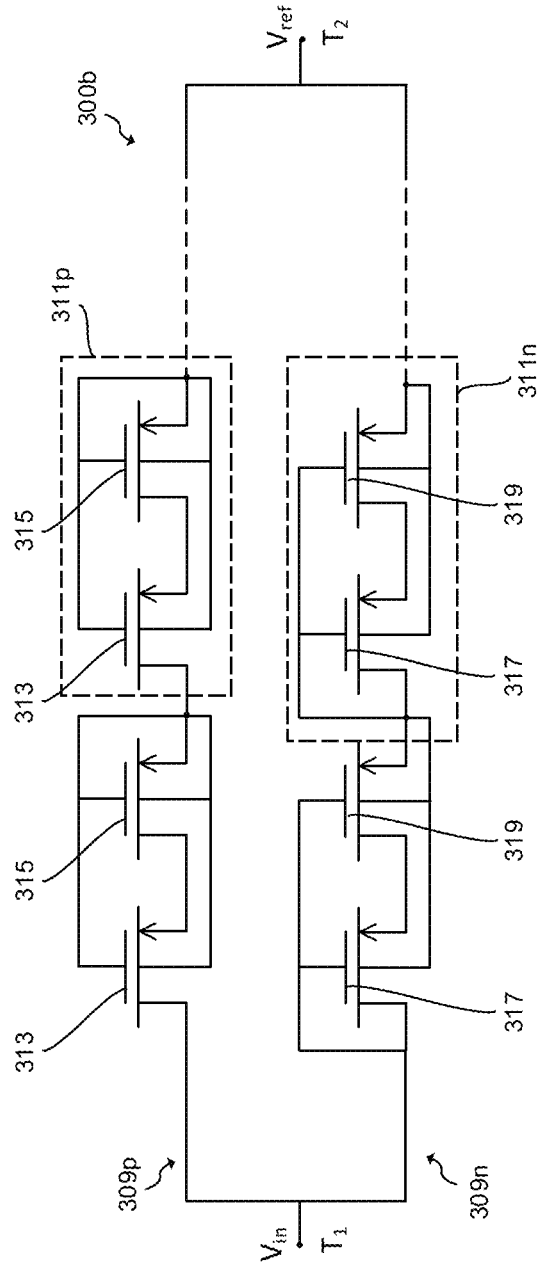

FIGS. 3A and 3B illustrate embodiment high-ohmic branches 300a and 300b, respectively, which may be implemented as the high-ohmic branches $203_1$ to $203_N$ illustrated in FIGS. 2A and 2B. Referring to FIG. 3A, the high-ohmic branch 300a includes a positive signal branch 301p and a negative signal branch 301n connected in parallel between the input node $T_1$ and the reference node $T_2$. The positive signal branch 301p includes one or more resistive elements 303p that are coupled in series between the input node $T_1$ and the reference node $T_2$, and the negative signal branch 301n includes one or more resistive elements 303n that are coupled in series between the input node $T_1$ and the reference node $T_2$. In some embodiments, each of the resistive elements 303p may be implemented as a transistor 305 in a diode configuration, with a gate, a source and a body of the transistor 305 coupled to a common node. The diode-connected transistor 305 is coupled in a forward direction from the input node $T_1$ to the reference node $T_2$. In some embodiments, each of the resistive elements 303n may be implemented as a transistor 307 in a diode configuration, with a gate and a drain of the transistor 307 coupled to a first common node and with a body and a source of the transistor 307 coupled to a second common node. The diode-connected transistor 307 is coupled in a forward direction from the reference node $T_2$ to the input node $T_1$. In the illustrated embodiment, transistors 305 and 307 are PMOS transistors having similar structures, such as gate widths and lengths. In other embodiments, the resistive elements 303p and 303n may be implemented using NMOS transistors, or other suitable transistors.

Referring to FIG. 3B, the high-ohmic branch 300b includes a positive signal branch 309p and a negative signal branch 309n connected in parallel between the input node $T_1$ and the reference node $T_2$. The positive signal branch 309p includes one or more resistive elements 311p that are coupled in series between the input node $T_1$ and the reference node $T_2$, and the negative signal branch 309n includes one or more resistive elements 311n that are coupled in series between the input node $T_1$ and the reference node $T_2$. In some embodiments, each of the resistive elements 303p may be implemented as transistors 313 and 315 coupled in a diode configuration. A source of the transistor 313 and a drain of the transistor 315 are coupled to a first common node. Gates of the transistors 313 and 315, bodies of the transistors 313 and 315, and a source of the transistor 315 are coupled to a second common node. The diode-connected transistors 313 and 315 are coupled in a forward direction from the input node $T_1$ to the reference node $T_2$. In some embodiments, each of the resistive elements 311n may be implemented as transistors 317 and 319 in a diode configuration. A source of the transistor 317 and a drain of the transistor 319 are coupled to a first common node. Gates of the transistors 313 and 315, and a drain of the transistor 317 are coupled to a second common node. Bodies of the transistors 313 and 315, and a source of the transistor 319 are coupled to a third common node. The diode-connected transistors 317 and 319 are coupled in a forward direction from the reference node $T_2$ to the input node $T_1$. In the illustrated embodiments, the transistors 313, 315, 319 and 319 are PMOS transistors having similar structures, such as gate widths and lengths. In other embodiments, the resistive elements 311p and 311n may be implemented using NMOS transistors, or other suitable transistors.

The use of multiple resistive elements for forming the high-ohmic branches (the high-ohmic branches 300a and 300b) allows for high-voltage swings at the input node $T_1$. In some embodiments in which the MEMS sensor 101 (see FIG. 1A) is a microphone, sound waves with sound pressure levels greater than about 130 dBSPL may be sensed. For example, at the sound pressure levels of about 140 dBSPL, the MEMS sensor 101 provides the input voltage $V_{in}$ of about 3.67 V at the input node $T_1$. In some embodiments, the high-ohmic branches 300a and 300b not only allows for increased input signal swing at the input node T1, but may also be used for on-purpose clipping of the input signal $V_{in}$ to avoid amplifier and analog-to-digital converter (ADC) overload. By clipping the input signal $V_{in}$ in the analog regime, a total harmonic distortion (THD) of a microphone may be improved.

Referring further to FIGS. 3A and 3B, the resistive elements 303p, 303n, 311p and 311n are implemented with one or two transistors. In other embodiments, the resistive elements may be implemented using more than two transistors. The use of multiple transistors for forming the resistive elements allows for further tuning of an impedance and voltage clipping levels of high-ohmic branches 300a and 300b and, consequently, of a high-ohmic circuit. In some embodiments, the impedance of the resistive elements 303p, 303n, 311p and 311n may be tuned by tuning structural dimensions of the transistors 305, 307, 313, 315, 317 and 319.

Figure 4A:
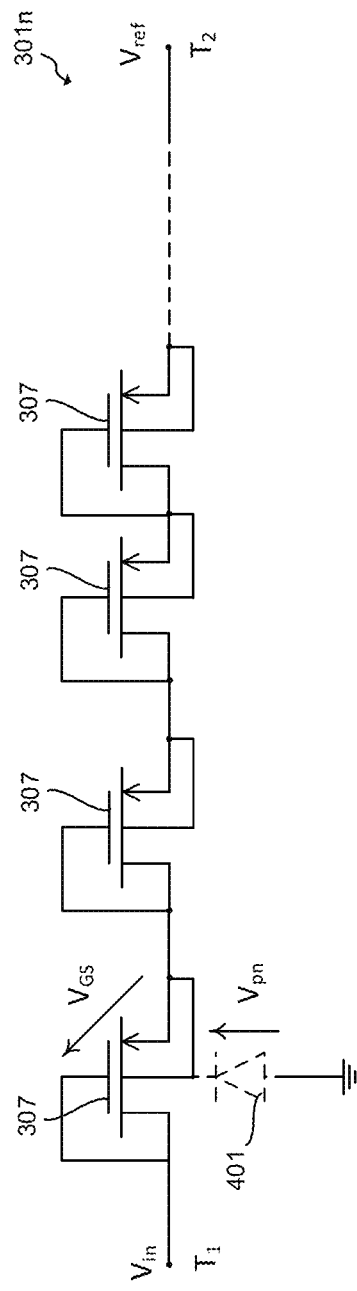
FIGS. 4A, 4B, 4C and 4D illustrate negative signal branches of embodiment high-ohmic circuits.
Figure 4B:
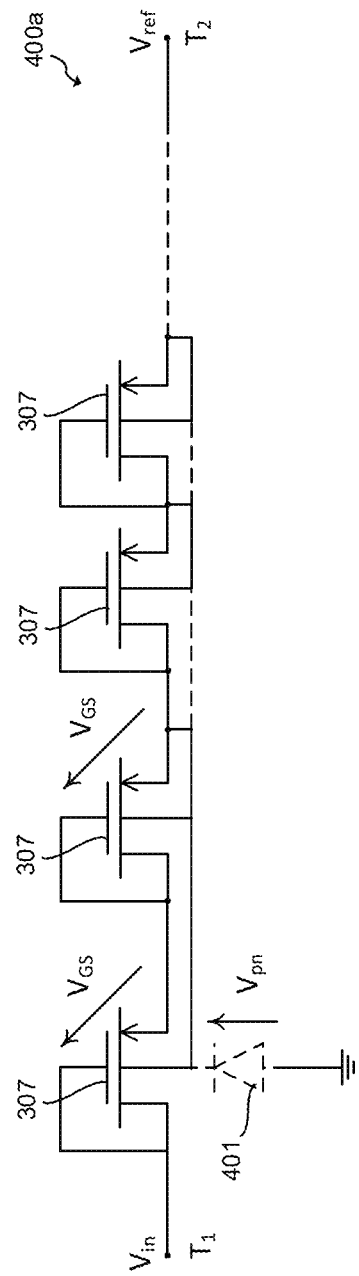
Figure 4C:
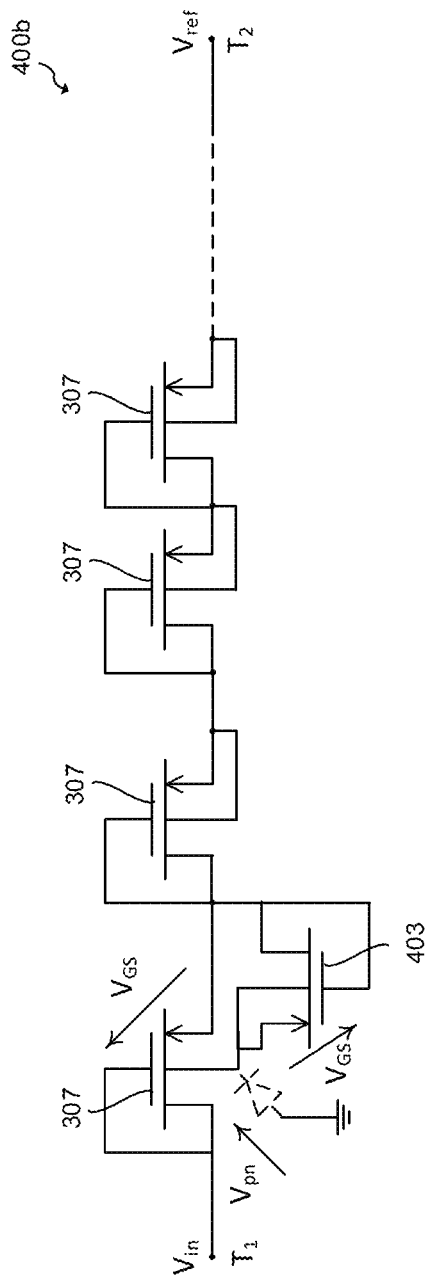

As described below in greater detail, in some embodiments, the input signal swing at the input node $T_1$ may be extended. The concept is described below with reference to a negative input signal swing. A similar concept may also be applied to a positive input signal swing. FIG. 4A illustrates the negative signal branch 301n of the high-ohmic branch 300a, with an n-well/bulk substrate parasitic diode 401 of the transistor 307 closest to the input node $T_1$ explicitly shown. In the illustrated embodiment, a negative input signal swing at the input node $T_1$ is limited by $V_{pn}+V_{GS}$, where $V_{pn}$ is a voltage across the parasitic diode 401 and $V_{GS}$ is a voltage across the diode-connected transistor 307. In some embodiments, the negative input signal swing may be extended by coupling bodies of the transistors 307. Such an embodiment negative signal branch 400a is illustrated in FIG. 4B, where bodies of two transistors 307 closest to the input node $T_1$ are coupled. In some embodiments, bodies of more than two transistors 307 may be optionally coupled as illustrated by dashed lines in FIG. 4B. In the illustrated embodiment, the negative input signal swing at the input node $T_1$ is limited by $V_{pn}+2 \cdot V_{GS}$. In some embodiments, the negative input signal swing may be also extended by coupling an additional transistor between the adjacent transistors 307 closest to the input node $T_1$. Such an embodiment negative signal branch 400b is illustrated in FIG. 4C, where a transistor 403 is coupled between the adjacent transistors 307 closest to the input node $T_1$. In the illustrated embodiment, the negative input signal swing at the input node $T_1$ is limited by $V_{pn}+2 \cdot V_{GS}$.

Figure 4D:
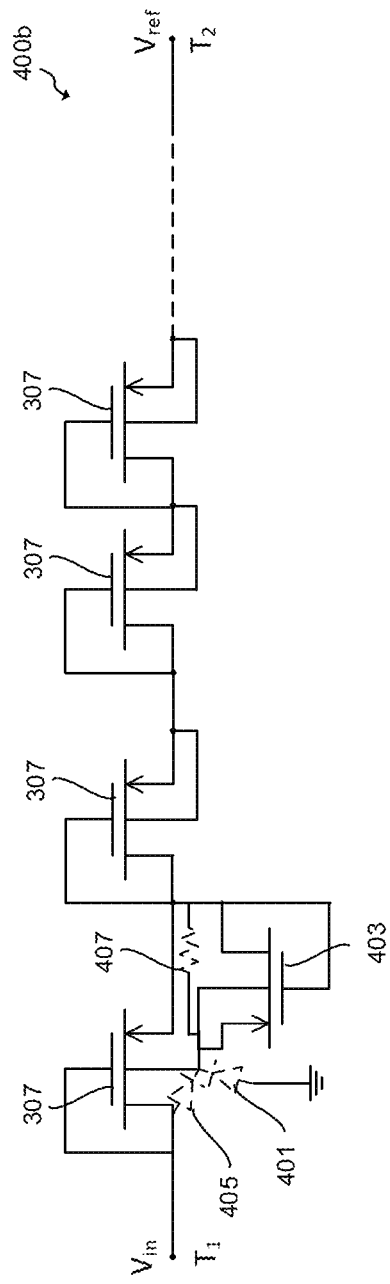

In addition to providing extended input signal levels, the high-ohmic branches 300a and 300b may also provide an ESD protection though parasitic junctions and wells of the diode-connected transistors. For example, FIG. 4D illustrates the negative signal branch 400b, with an n-well/bulk substrate parasitic diode 401 and a p+/n-well parasitic diode 405 explicitly shown. During an ESD event, a discharge current flows though the parasitic diode 405 and the diode-connected transistor 403, which acts as a high-ohmic resistor 407.

Figure 5A:
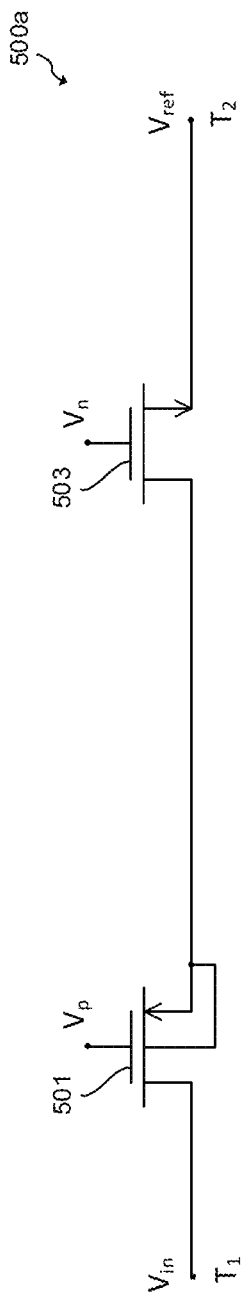
FIGS. 5A and 5B illustrate low-impedance branches of embodiment high-ohmic circuits.
Figure 5B:
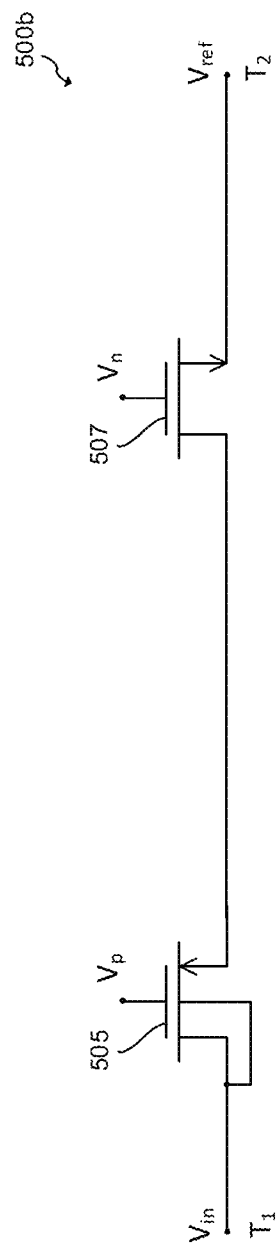

FIGS. 5A and 5B illustrate embodiment low-impedance branches 500a and 500b, respectively, which may be may be implemented as the low-impedance branch 201 illustrated in FIGS. 2A and 2B. Referring to FIG. 5A, the low-impedance branch 500a includes transistors 501 and 503 coupled in series between the input node $T_1$ and the reference node $T_2$. A drain of the transistor 501 is coupled to the input node $T_1$. A body and a source of the transistor 501, and a drain of the transistor 503 are coupled to a common node. A source of the transistor 503 is coupled to the reference node $T_2$. In some embodiments, gates of the transistors 501 and 503 may be coupled to one or more voltage sources, such as charge pumps, or ground to provide a voltage $V_p$ to the gate of the transistor 501 and a voltage $V_n$ to the gate of the transistor 503. In the illustrated embodiment, the transistor 501 is a PMOS transistor and the transistor 503 is an NMOS transistor. In other embodiments, the transistors 501 and 503 may be implemented using any suitable transistors.

In some embodiments, during the sensing regime, the voltage $V_p$ provided to the gate of the transistor 501 is a positive voltage, while the gate of the transistor 503 is coupled to ground. In other embodiments, the voltage $V_n$ provided to the gate of the transistor 503 is a negative voltage. In the sensing regime, the transistors 501 and 503 are turned off and the low-impedance branch 500a acts as a high-ohmic resistor. During the start-up regime, the voltage $V_p$ provided to the gate of the transistor 501 is a negative voltage and the voltage $V_n$ provided to the gate of the transistor 503 is a positive voltage. In the start-up regime, the transistors 501 and 503 are turned on and the low-impedance branch 500a acts as a low-ohmic/low-impedance resistor. In some embodiments, the low-impedance branch 500a may provide an ESD protection at the input node $T_1$. The ESD protection is provided though parasitic junctions and wells of the transistor 501. In the illustrated embodiment, the ESD discharge occurs through a p+/n-well parasitic diode (not explicitly illustrated) of the transistor 501.

Referring to FIG. 4B, the low-impedance branch 500b includes transistors 505 and 507 coupled in series between the input node $T_1$ and the reference node $T_2$. A drain and a body of the transistor 505 are coupled to the input node $T_1$. A source of the transistor 505 is coupled to a drain of the transistor 507. A source of the transistor 507 is coupled to the reference node $T_2$. In some embodiments, gates of the transistors 505 and 507 may be coupled to one or more voltage sources, such as charge pumps, or ground to provide the voltage $V_p$ to the gate of transistor 505 and the voltage $V_n$ to the gate of transistor 507. In the illustrated embodiment, the transistor 505 is a PMOS transistor and the transistor 507 is an NMOS transistor. In other embodiments, the transistors 505 and 507 may be implemented using any suitable transistors.

In some embodiments, the low-impedance branch 500b may be set to the sensing mode and the strut-up mode using a similar method as described above with reference to the low-impedance branch 500a and the description is not repeated for the sake of brevity. In some embodiments, the low-impedance branch 500b may provide an ESD protection at the input node $T_1$. The ESD protection is provided though parasitic junctions and wells of the transistor 505. In the illustrated embodiment, the ESD discharge occurs through n-well/bulk substrate parasitic diode (not explicitly illustrated) of the transistor 505.

Figure 6:
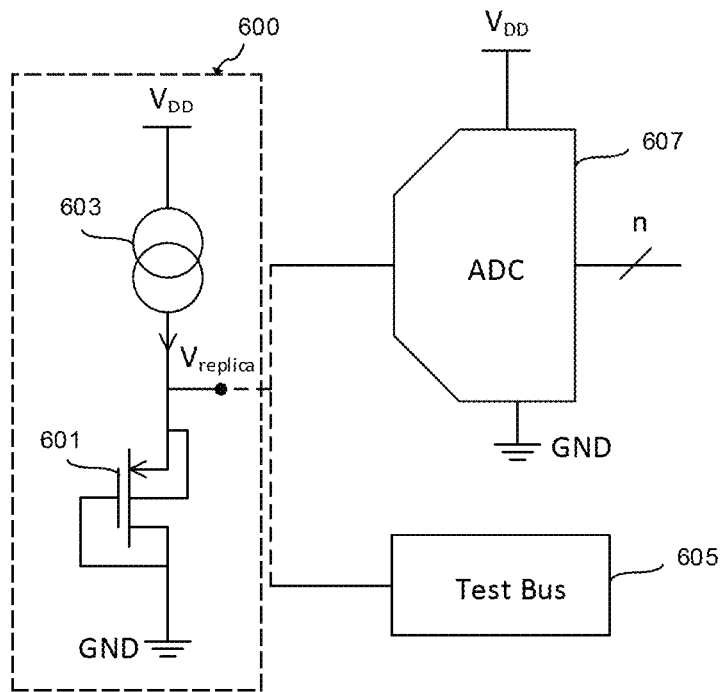
FIG. 6 illustrates an embodiment reference circuit for determining process corners.

FIG. 6 illustrates an embodiment reference circuit 600, which can be implanted as the reference circuit 123 (see FIGS. 1A, 1B and 1C) for determining process corners. In some embodiments, while fabricating the high-ohmic circuits (such as, for example, high-ohmic circuits 200a and 200b illustrated in FIGS. 2A and 2B) on a wafer, a reference diode-connected transistor 601 may be formed on the wafer adjacent to the high-ohmic circuits. In the illustrated embodiment, the reference diode-connected transistor 601 is formed to be structurally identical to diode-connected transistors of the high-ohmic circuits. The reference diode-connected transistor 601 is biased using a known current from a current source 603 and a voltage $V_{replica}$ across the reference diode-connected transistor 601 is measured though a test bus 605 or an ADC 607. In other embodiments, the reference diode-connected transistor 601 may be a scaled version of the diode-connected transistors of the high-ohmic circuits, with a corresponding increase or decrease in the current provided by the current source. Furthermore, the reference diode-connected transistor 601 is simulated to determine current/voltage characteristics for various temperatures and process corners. The measured voltage $V_{replica}$ is compared to a simulated voltage $V_{sim}$ to detect the process corner of the wafer. Temperature and process corner information is used to program the high-ohmic circuits.

Figure 7:
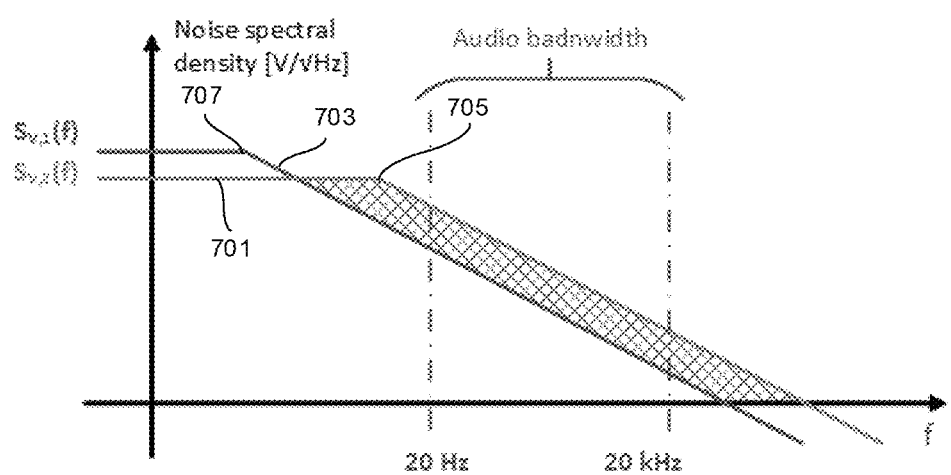
FIG. 7 illustrates plots of noise power spectral density vs log of frequency for an embodiment MEMS sensor system.

In some embodiments, process corner and temperature variations may degrade the signal-to-noise ratio (SNR) of a MEMS sensor system (such as the MEMS sensor systems 100A, 100B and 100C illustrated in FIGS. 1A, 1B and 1C, respectively). In some embodiments in which a MEMS sensor (such as the MEMS sensor 101 illustrated in FIG. 1A) of the MEMS sensor system is a microphone, by programming a high-ohmic circuit (such as the high-ohmic circuit 115 illustrated in FIGS. 1A, 1B and 1C) of the MEMS sensor system to increase a resistance of the high-ohmic circuit, SNR degradation within the audio bandwidth may be reduced or avoided. FIG. 7 illustrates plots of noise power spectral density vs log of frequency for an embodiment MEMS sensor system. Plots 701 and 703 illustrate noise power spectral densities $S_{V,1}$ and $S_{V,2}$, respectively, for different resistances of the high-ohmic circuit. In the illustrated embodiment, the plot 703 corresponds to higher resistance than the plot 701, where an RC pole 705 of the plot 701 occurs at higher frequency than an RC pole 707 of the plot 703. By increasing the resistance of the high-ohmic circuit, the noise power spectral density is increased for low frequencies. However, for high frequencies that include the audio band (between about 20 Hz and about 20 kHz) the noise power spectral density is decreased. By suitably increasing the resistance of the high-ohmic circuit, an integrated noise in the audio band may be reduced. In the illustrated embodiment, the high-frequency integrated noise for the plot 703 is reduced compared to the plot 701 by a shaded area between the plots 701 and 703.

Figure 8:
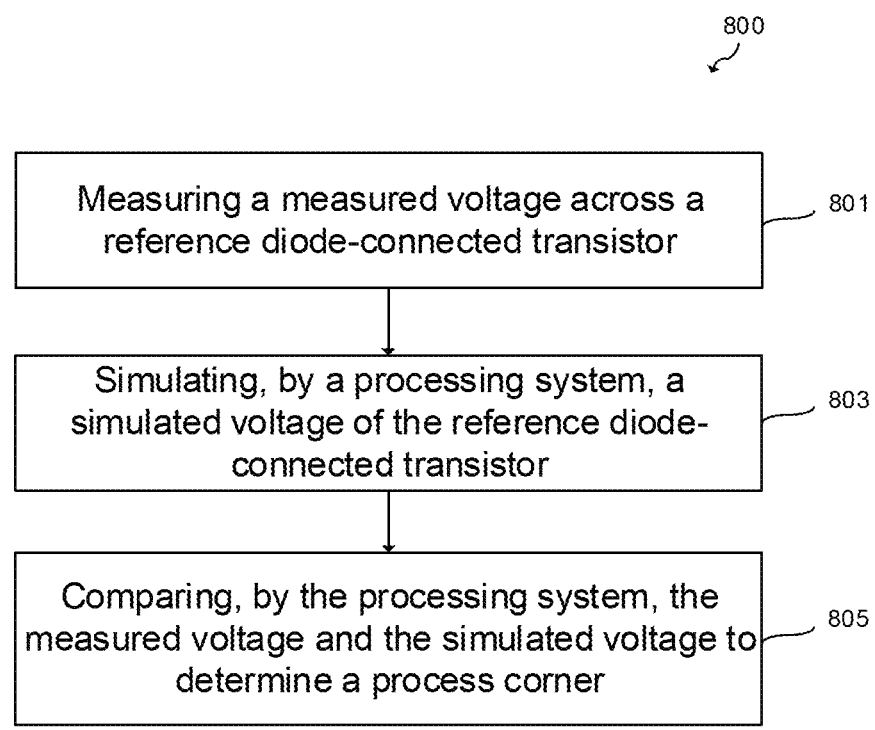
FIG. 8 illustrates a flowchart diagram of an embodiment method for determining a process corner.

FIG. 8 illustrates a flowchart diagram of an embodiment method 800 for determining a process corner, where steps of the method 800 are described in conjunction with FIGS. 1A, 1D and 6. The method 800 starts at step 801, where a voltage across the reference diode-connected transistor 601 is measured. In step 803, a voltage across the reference diode-connected transistor 601 is simulated. In some embodiments, the simulation may be performed by a processing system similar to the processing system 127 illustrated in FIG. 1D. In step 805, the processing system compares the measured voltage and the simulated voltage to determine a process corner. In some embodiments, information regarding the process corners may be stored on a non-volatile memory of a sensor system couple (such as the NVM 125 of the MEMS sensor system 101A illustrated in FIG. 1A). In other embodiments, information regarding the process corners may be stored on a mass storage device of the processing system (such as the mass storage device 133 of the processing system 127 illustrated in FIG. 1D).

Figure 9:
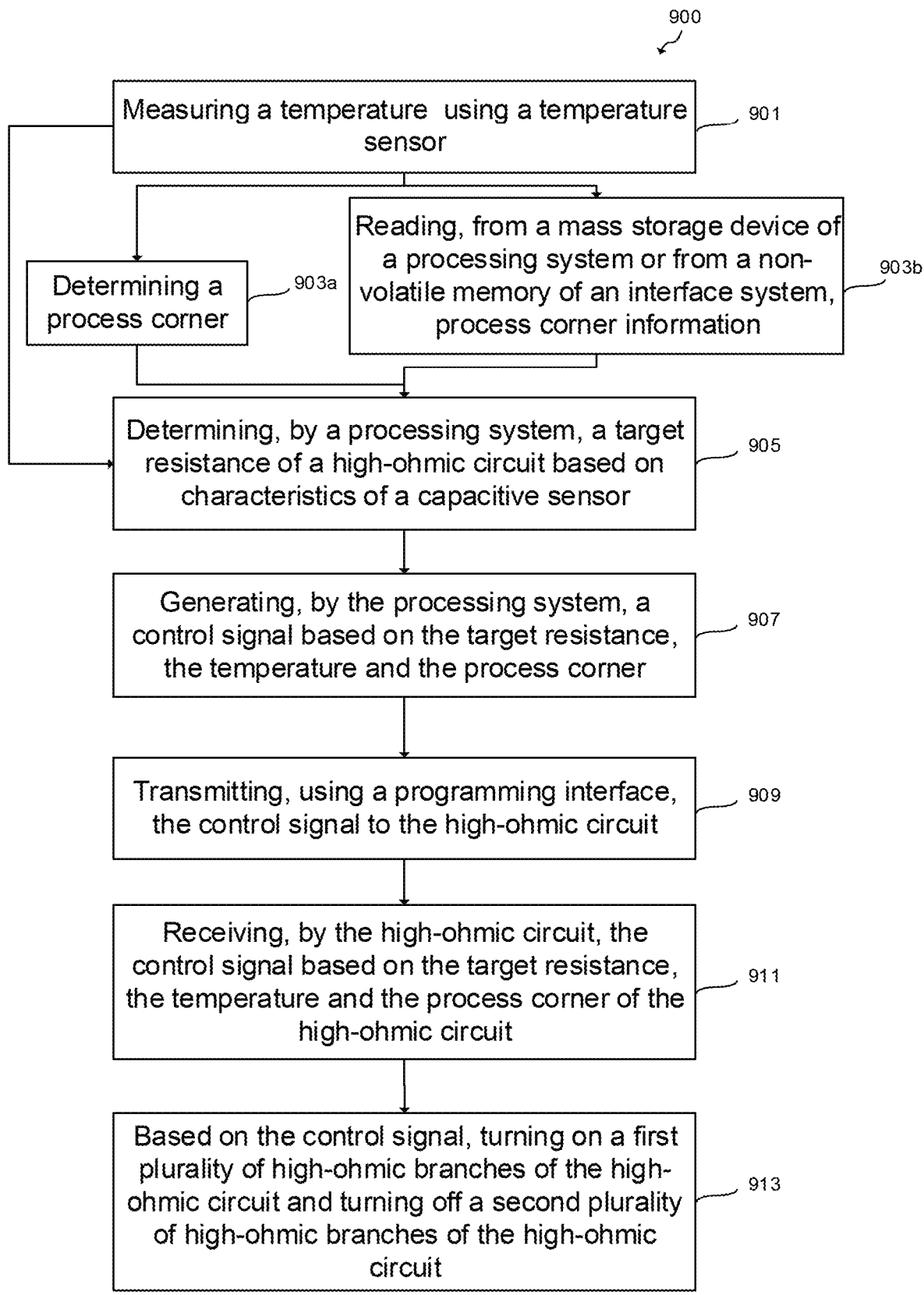
FIG. 9 illustrates a flowchart diagram of an embodiment method for programming a high-ohmic circuit.

FIG. 9 illustrates a flowchart diagram of an embodiment method 900 for programming a high-ohmic circuit, where steps of the method 900 are described in conjunction with FIGS. 1A, 1D, 2A and 2B. The method 900 starts with step 901, where the temperature sensor 119 measures a temperature of the high-ohmic circuit 115. In step 903a, a process corner is determined. In some embodiments, the process corner is determined using a method similar to the method 800 illustrated in FIG. 8. In other embodiments, instead of step 903a, an alternative step 903b is performed. In step 903b, preloaded process corner information is read from the NVM 125 of the interface circuit 103. Alternatively, preloaded process corner information is read from the mass storage device 133 of the processing system 127. In some embodiments, the step 901 may be skipped or omitted and the method 900 may start with step 903a or step 903b. In other embodiments, the steps 903a or 903b may be skipped or omitted and the step 901 may continue to step 905. In step 905, the processing system 127 determines a target resistance of the high-ohmic circuit 115 based on characteristics of the MEMS sensor 101. In step 907, the processing system 127 generates a control signal based on the target resistance, the temperature and the process corner. In step 909, the control signal is transmitted to the high-ohmic circuit 115 through the programming interface 121. In step 911, the control signal is received by the high-ohmic circuit 115. In step 913, based on the control signal, a first plurality of the switches $205_1$ to $205_N$ of the high-ohmic circuits 200a or the high-ohmic circuits 200b are turned on to turn on corresponding ones of the high-ohmic branches $203_1$ to $203_N$ of the high-ohmic circuits 200a or the high-ohmic circuits 200b. Furthermore, a second plurality of the switches $205_1$ to $205_N$ of the high-ohmic circuit 200a or the high-ohmic circuits 200b are turned off to turn off corresponding ones of the high-ohmic branches $203_1$ to $203_N$ of the high-ohmic circuits 200a or the high-ohmic circuits 200b.

Figure 10:
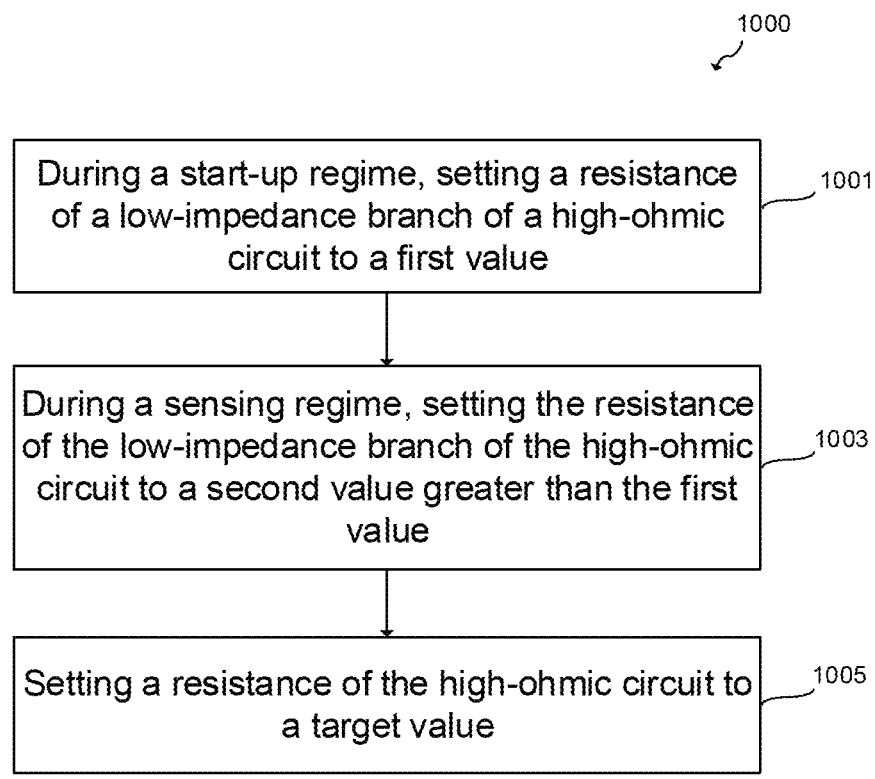
FIG. 10 illustrates a flowchart diagram of an embodiment method for operating a high-ohmic circuit.

FIG. 10 illustrates a flowchart diagram of an embodiment method 1000 for operating a high-ohmic circuit, where steps of the method 1000 are described in conjunction with FIGS. 2A and 2B. The method 1000 starts at step 1001, where during the start-up regime, a resistance of the low-impedance branch 201 of the high-ohmic circuit 200a or the high-ohmic circuit 200b is set to a first value. In step 1003, the sensing regime, the resistance of the low-impedance branch 201 of the high-ohmic circuit 200a or the high-ohmic circuit 200b is set to a second value greater than the first value. In step 1005, a resistance of the high-ohmic circuit 200a or the high-ohmic circuit 200b is set to a target value. In some embodiments, step 1005 may be performed using a method similar to the method 900 illustrated in FIG. 9.

Various embodiments presented herein allow for programmable high-ohmic circuits having tunable resistances. In some embodiments, the high-ohmic circuits allow for high negative/positive signal swings at the input node. In some embodiments, the high-ohmic circuits have a plurality of the high-ohmic branches and a low-impedance branch compatible with large input signals. Various methods described herein allow for compensating for temperature variations, process corner variations and/or MEMS sensor characteristics variations. Furthermore, the use of the high-ohmic circuits allows for improving signal-to-noise ratio (SNR) of a MEMS sensor system by adjusting a resistance of the high-ohmic circuits through programming.

Embodiments of the present invention are summarized here. Other embodiments can also be understood form the entirety of the specification and the claims filed herein. One general aspect includes a high-ohmic circuit including: a plurality of high-ohmic branches coupled in parallel between a first node and a second node, each of the plurality of high-ohmic branches including: a first plurality of series connected resistive elements forming a first series path from the first node to the second node, each of the first plurality of series connected resistive elements including a first diode-connected transistor; and a second plurality of series connected resistive elements forming a second series path from the first node to the second node, each of the second plurality of series connected resistive elements including a second diode-connected transistor; and a plurality of switches, each of the switches being coupled between a corresponding one of the plurality of high-ohmic branches and the second node.

Implementations may include one or more of the following features. The high-ohmic circuit further including: a low-impedance branch coupled between a third node and the second node, the low-impedance branch including: a first transistor having a drain terminal coupled to the third node; and a second transistor having a source terminal coupled to the second node, a source terminal of the first transistor being coupled to a drain of the second transistor. The high-ohmic circuit further including a low parasitics branch coupled between the third node and the first node. The high-ohmic circuit, where the first transistor is a PMOS transistor, and where the second transistor is an NMOS transistor. The high-ohmic circuit, where a body terminal of the PMOS transistor is coupled to a source terminal of the PMOS transistor. The high-ohmic circuit, where a body terminal of the PMOS transistor is coupled to a drain terminal of the PMOS transistor. The high-ohmic circuit, where the first diode-connected transistor the second diode-connected transistor are diode-connected PMOS transistors. The high-ohmic circuit, where the first diode-connected transistor includes: a drain terminal coupled to a first diode node; and a source terminal, a gate terminal and a body terminal coupled to a second diode node. The high-ohmic circuit, where each of the first plurality of series connected resistive elements further includes an additional diode-connected transistor coupled to the first diode-connected transistor, a source terminal of the additional diode-connected transistor being coupled to the drain terminal of the first diode-connected transistor, a gate terminal of the additional diode-connected transistor being coupled to the gate terminal of the first diode-connected transistor, and a body terminal of the additional diode-connected transistor being coupled to the body terminal of the first diode-connected transistor. The high-ohmic circuit, where the second diode-connected transistor includes: a drain terminal and a gate terminal coupled to a first diode node; and a source terminal and a body terminal coupled to a second diode node. The high-ohmic circuit, where each of the second plurality of series connected resistive elements further includes an additional diode-connected transistor coupled to the second diode-connected transistor, a source terminal of the additional diode-connected transistor being coupled to the drain terminal of the second diode-connected transistor, a gate terminal of the additional diode-connected transistor being coupled to the gate terminal of the second diode-connected transistor, and a body terminal of the additional diode-connected transistor being coupled to the body terminal of the second diode-connected transistor.

Another general aspect includes a sensing circuit including: a capacitive sensor configured to generate a signal output voltage; an amplifier coupled to the capacitive sensor and configured to receive the signal output voltage; and a high-ohmic circuit coupled to the capacitive sensor and the amplifier, the high-ohmic circuit including: a high-ohmic branch coupled between a first node and a second node, the high-ohmic branch including a plurality of series connected resistive elements, each of the plurality of series connected resistive elements including at least one diode-connected transistor; a first switch coupled between the high-ohmic branch and the second node; and a low-impedance branch coupled to the second node, the low-impedance branch including at least one transistor.

Implementations may include one or more of the following features. The sensing circuit further including a bias voltage circuit coupled to the capacitive sensor and configured to generate a bias voltage and provide the bias voltage to the capacitive sensor. The sensing circuit further including an additional high-ohmic circuit coupled between the bias voltage circuit and the capacitive sensor. The sensing circuit, where the capacitive sensor includes a microelectromechanical systems (MEMS) microphone. The sensing circuit, where the high-ohmic circuit is coupled from an input of the amplifier to a reference node. The sensing circuit further including a programming interface coupled to the high-ohmic circuit. The sensing circuit further including a temperature sensor coupled to the programming interface, the temperature sensor being configured to measure a temperature of the high-ohmic circuit. The sensing circuit further including a reference circuit coupled to the programming interface, the reference circuit including one or more reference diode-connected transistors, the one or more reference diode-connected transistors being similar to the at least one diode-connected transistor. The sensing circuit further including a non-volatile memory coupled to the programming interface. The sensing circuit further including a processing system coupled to the programming interface. The sensing circuit further including a low parasitics branch coupled to the first node. The sensing circuit, where a body terminal and a gate terminal of the at least one diode-connected transistor is coupled to a source terminal of the at least one diode-connected transistor. The sensing circuit, where a body terminal of the at least one diode-connected transistor is coupled to a source terminal of the at least one diode-connected transistor, and where a gate terminal of the at least one diode-connected transistor is coupled to a drain terminal of the at least one diode-connected transistor. The sensing circuit further including a reference voltage source coupled to the high-ohmic branch at the second node.

Another general aspect includes a method of programming a high-ohmic circuit coupled to a capacitive sensor, the method including: measuring a temperature using a temperature sensor coupled to the high-ohmic circuit; receiving, by the high-ohmic circuit, a control signal based on a target resistance, the temperature and a process corner of the high-ohmic circuit; and based on the control signal, turning on a first plurality of high-ohmic branches of the high-ohmic circuit and turning off a second plurality of high-ohmic branches of the high-ohmic circuit.

Implementations may include one or more of the following features. The method further including: determining, by a processing system, the target resistance of the high-ohmic circuit based on characteristics of the capacitive sensor; generating, by the processing system, the control signal based on the target resistance, the temperature and the process corner of the high-ohmic circuit; and transmitting, using a programming interface coupled between the processing system and the of the high-ohmic circuit, the control signal to the high-ohmic circuit. The method further including determining the process corner of the high-ohmic circuit. The method, where determining the process corner of the high-ohmic circuit includes: measuring a measured voltage across a reference diode-connected transistor, the reference diode-connected transistor being similar to a diode-connected transistor of the high-ohmic circuit; simulating, by the processing system, a simulated voltage across the reference diode-connected transistor; and comparing, by the processing system, the measured voltage and the simulated voltage to determine the process corner of the high-ohmic circuit. The method, where turning on the first plurality of high-ohmic branches includes turning on switches coupled to the first plurality of high-ohmic branches. The method, where turning off the second plurality of high-ohmic branches includes turning off switches coupled to the second plurality of high-ohmic branches.

It should be appreciated that one or more steps of the embodiment methods provided herein may be performed by corresponding units or modules. For example, a signal may be transmitted by a transmitting unit or a transmitting module. A signal may be received by a receiving unit or a receiving module. A signal may be processed by a processing unit or a processing module. Other steps may be performed by a simulating unit/module, a generating unit/module, a determining unit/module, a reading unit/module, a storing unit/module, a computing unit/module, a comparing unit/module, a correcting unit/module, and/or a setting unit/module. The respective units/modules may be hardware, software, or a combination thereof. For instance, one or more of the units/modules may be an integrated circuit, such as field programmable gate arrays (FPGAs) or application-specific integrated circuits (ASICs).

While this disclosure has been described with reference to illustrative embodiments, this description is not intended to be construed in a limiting sense. Various modifications and combinations of the illustrative embodiments, as well as other embodiments of the disclosure, will be apparent to persons skilled in the art upon reference to the description. It is therefore intended that the appended claims encompass any such modifications or embodiments.

What is claimed is:

1. A high-ohmic circuit comprising:
  a plurality of high-ohmic branches coupled in parallel between a first node and a second node, the first node being coupled to a capacitive sensor and an amplifier, the second node being directly coupled to a reference voltage source, each of the plurality of high-ohmic branches comprising:
- a first plurality of series connected resistive elements forming a first series path from the first node to the second node, each of the first plurality of series connected resistive elements comprising a first diode-connected transistor;
- a second plurality of series connected resistive elements forming a second series path from the first node to the second node, each of the second plurality of series connected resistive elements comprising a second diode-connected transistor; and
- a first transistor and a second transistor coupled between the first node and the second plurality of series connected resistive elements, a gate terminal and a drain terminal of the first transistor being coupled to the first node, a body terminal of the first transistor being directly coupled to a source terminal and a body terminal of the second transistor, and a source terminal of the first transistor being directly coupled to a gate terminal and a drain terminal of the second transistor; and a plurality of switches, each of the plurality of switches being directly coupled to the second node, each of the plurality of switches and a corresponding one of the plurality of high-ohmic branches being coupled in series between the first node and the second node, each of the plurality of high-ohmic branches being coupled to the second node only through a corresponding one of the plurality of switches.

2. The high-ohmic circuit of claim 1, further comprising:
a low-impedance branch coupled between a third node and the second node, the low-impedance branch comprising:
- a third transistor having a drain terminal coupled to the third node; and
- a fourth transistor having a source terminal coupled to the second node, a source terminal of the third transistor being coupled to a drain of the fourth transistor.

3. The high-ohmic circuit of claim 2, further comprising a low parasitics branch coupled between the third node and the first node.

4. The high-ohmic circuit of claim 2, wherein the third transistor is a PMOS transistor, and wherein the fourth transistor is an NMOS transistor.

5. The high-ohmic circuit of claim 4, wherein a body terminal of the PMOS transistor is coupled to a source terminal of the PMOS transistor.

6. The high-ohmic circuit of claim 4, wherein a body terminal of the PMOS transistor is coupled to a drain terminal of the PMOS transistor.

7. The high-ohmic circuit of claim 1, wherein the first diode-connected transistor the second diode-connected transistor are diode-connected PMOS transistors.

8. The high-ohmic circuit of claim 7, wherein the first diode-connected transistor comprises:
- a drain terminal coupled to a first diode node; and
- a source terminal, a gate terminal and a body terminal coupled to a second diode node.

9. The high-ohmic circuit of claim 8, wherein each of the first plurality of series connected resistive elements further comprises an additional diode-connected transistor coupled to the first diode-connected transistor, a source terminal of the additional diode-connected transistor being coupled to the drain terminal of the first diode-connected transistor, a gate terminal of the additional diode-connected transistor being coupled to the gate terminal of the first diode-connected transistor, and a body terminal of the additional diode-connected transistor being coupled to the body terminal of the first diode-connected transistor.

10. The high-ohmic circuit of claim 7, wherein the second diode-connected transistor comprises:
- a drain terminal and a gate terminal coupled to a first diode node; and
- a source terminal and a body terminal coupled to a second diode node.

11. The high-ohmic circuit of claim 10, wherein each of the second plurality of series connected resistive elements further comprises an additional diode-connected transistor coupled to the second diode-connected transistor, a source terminal of the additional diode-connected transistor being coupled to the drain terminal of the second diode-connected transistor, a gate terminal of the additional diode-connected transistor being coupled to the gate terminal of the second diode-connected transistor, and a body terminal of the additional diode-connected transistor being coupled to the body terminal of the second diode-connected transistor.

12. A sensing circuit comprising:
- a capacitive sensor configured to generate a signal output voltage;
- an amplifier coupled to the capacitive sensor and configured to receive the signal output voltage; and
- a high-ohmic circuit coupled to the capacitive sensor and the amplifier through a first node, the high-ohmic circuit comprising:
  - a low parasitics branch directly coupled to the first node;
  - a high-ohmic branch coupled between the low parasitics branch and a second node, the high-ohmic branch comprising a plurality of series connected resistive elements, each of the plurality of series connected resistive elements comprising at least one diode-connected transistor;
  - a first switch coupled between the high-ohmic branch and the second node, the first switch being directly coupled to the second node, the first switch and the high-ohmic branch being coupled in series between the first node and the second node, the high-ohmic branch being coupled to the second node only through the first switch;
  - a low-impedance branch directly coupled to the first node and the second node, the low-impedance branch comprising at least one transistor; and
  - a first transistor and a second transistor coupled between the low parasitics branch and the plurality of series connected resistive elements, a gate terminal and a drain terminal of the first transistor being directly coupled to the low parasitics branch, a body terminal of the first transistor being directly coupled to a source terminal and a body terminal of the second transistor, and a source terminal of the first transistor being directly coupled to a gate terminal and a drain terminal of the second transistor.

13. The sensing circuit of claim 12, further comprising a bias voltage circuit coupled to the capacitive sensor and configured to generate a bias voltage and provide the bias voltage to the capacitive sensor.

14. The sensing circuit of claim 13, further comprising an additional high-ohmic circuit coupled between the bias voltage circuit and the capacitive sensor.

15. The sensing circuit of claim 12, wherein the capacitive sensor comprises a microelectromechanical systems (MEMS) microphone.

16. The sensing circuit of claim 12, wherein the high-ohmic circuit is coupled from an input of the amplifier to a reference node.

17. The sensing circuit of claim 12, further comprising a programming interface coupled to the high-ohmic circuit.

18. The sensing circuit of claim 17, further comprising a temperature sensor coupled to the programming interface, the temperature sensor being configured to measure a temperature of the high-ohmic circuit.

19. The sensing circuit of claim 17, further comprising a reference circuit coupled to the programming interface, the reference circuit comprising one or more reference diode-connected transistors, the one or more reference diode-connected transistors being similar to the at least one diode-connected transistor.

20. The sensing circuit of claim 17, further comprising a non-volatile memory coupled to the programming interface.

21. The sensing circuit of claim 17, further comprising a processing system coupled to the programming interface.

22. The sensing circuit of claim 12, wherein a body terminal and a gate terminal of the at least one diode-connected transistor is coupled to a source terminal of the at least one diode-connected transistor.

23. The sensing circuit of claim 12, wherein a body terminal of the at least one diode-connected transistor is coupled to a source terminal of the at least one diode-connected transistor, and wherein a gate terminal of the at least one diode-connected transistor is coupled to a drain terminal of the at least one diode-connected transistor.

24. The sensing circuit of claim 12, further comprising a reference voltage source coupled to the high-ohmic branch at the second node.

25. A method of programming a high-ohmic circuit coupled to a capacitive sensor, the method comprising:
measuring a measured temperature using a temperature sensor coupled to the high-ohmic circuit, the high-ohmic circuit comprising:
a high-ohmic branch coupled between a first node and a second node, the first node being coupled to the capacitive sensor, the second node being directly coupled to a reference voltage source, the high-ohmic branch comprising a plurality of series connected resistive elements, each of the plurality of series connected resistive elements comprising at least one diode-connected transistor, wherein the high-ohmic branch further comprises a first transistor and a second transistor coupled between the first node and the plurality of series connected resistive elements, a gate terminal and a drain terminal of the first transistor being coupled to the first node, a body terminal of the first transistor being directly coupled to a source terminal and a body terminal of the second transistor, and a source terminal of the first transistor being directly coupled to a gate terminal and a drain terminal of the second transistor;
a first switch coupled between the high-ohmic branch and the second node, the first switch being directly coupled to the second node, the first switch and the high-ohmic branch being coupled in series between the first node and the second node, the high-ohmic branch being coupled to the second node only through the first switch; and
a low-impedance branch directly coupled to the second node, the low-impedance branch comprising at least one transistor;
receiving, by the high-ohmic circuit, a control signal based on a target resistance, the measured temperature and a process corner of the high-ohmic circuit; and
based on the control signal, turning on a first plurality of high-ohmic branches of the high-ohmic circuit and turning off a second plurality of high-ohmic branches of the high-ohmic circuit.

26. The method of claim 25, further comprising:
determining, by a processing system, the target resistance of the high-ohmic circuit based on characteristics of the capacitive sensor;
generating, by the processing system, the control signal based on the target resistance, the measured temperature and the process corner of the high-ohmic circuit; and
transmitting, using a programming interface coupled between the processing system and the of the high-ohmic circuit, the control signal to the high-ohmic circuit.

27. The method of claim 26, further comprising determining the process corner of the high-ohmic circuit.

28. The method of claim 27, wherein determining the process corner of the high-ohmic circuit comprises:
measuring a measured voltage across a reference diode-connected transistor, the reference diode-connected transistor being similar to a diode-connected transistor of the high-ohmic circuit;
simulating, by the processing system, a simulated voltage across the reference diode-connected transistor; and
comparing, by the processing system, the measured voltage and the simulated voltage to determine the process corner of the high-ohmic circuit.

29. The method of claim 25, wherein turning on the first plurality of high-ohmic branches comprises turning on switches coupled to the first plurality of high-ohmic branches.

30. The method of claim 25, wherein turning off the second plurality of high-ohmic branches comprises turning off switches coupled to the second plurality of high-ohmic branches.

31. The sensing circuit of claim 17, wherein the programming interface is an $I^2C$ interface.

* * * * *